(12) United States Patent
Arzel et al.

(10) Patent No.: US 8,009,769 B2
(45) Date of Patent: Aug. 30, 2011

(54) METHOD AND A DEVICE FOR DECODING SLICE CODES

(75) Inventors: Matthieu Arzel, Plouzane (FR); Fabrice Seguin, Morlaix (FR); Cyril Lahuec, Plougonvelen (FR)

(73) Assignee: France Telecom, Paris (FR)

( * ) Notice: Subject to any disclaimer, the term of this patent is extended or adjusted under 35 U.S.C. 154(b) by 795 days.

(21) Appl. No.: 11/885,978

(22) PCT Filed: Mar. 10, 2006

(86) PCT No.: PCT/FR2006/050208
§ 371 (c)(1),
(2), (4) Date: Mar. 24, 2008

(87) PCT Pub. No.: WO2006/095115
PCT Pub. Date: Sep. 14, 2006

(65) Prior Publication Data
US 2008/0285688 A1    Nov. 20, 2008

(30) Foreign Application Priority Data

Mar. 11, 2005 (FR) ..................... 05 02447

(51) Int. Cl.
*H04L 27/06* (2006.01)
(52) U.S. Cl. ....................................... 375/340
(58) Field of Classification Search .................. 375/340
See application file for complete search history.

(56) References Cited

U.S. PATENT DOCUMENTS 7,769,798 B2 * 8/2010 Banihashemi et al. ........ 708/801

OTHER PUBLICATIONS

F. Gioulekas et al., "A high-speed analog turbo decoder with low-energy consumption", Communications and Information Technology, 2004, IEEE International Symposium on Sapporo, Japan, pp. 33-38, Oct. 26-29, 2004.
F. Gioulekas et al., "A high-speed analog turbo decoder with low-energy consumption", Communications and Information Technology, 2004, IEEE International Symposium on Sapporo, Japan, pp. 33-38, Oct. 26-29, 2004.
D. Gnaedig et al., "On Multiple Slice Turbo Codes", IEEE, Apr. 4, 2003.
C. Berrou et al., "Multiple Parallel Concatenation of Circular Recursive Systematic Convolutional (CRSC) Codes", Annals of Telecommunications, vol. 54, No. 3/4, pp. 166-172, Mar. 1999.
V. Gaudet, et al., "A 13.3Mb/s 0.35µm CMOS Analog Turbo Decoder IC with a Configurable Interleaver", Internet Article, http://www.ece.ualberta.ca/{vgaudet/PAPERS/ISSCC2003.pdf>, Jun. 27, 2006.
M. Azrel et al., "Analogue decoding of duo-binary codes", International Symposium on Information and Theory and Its Applications, Oct. 13, 2004.

(Continued)

*Primary Examiner* — David C. Payne
*Assistant Examiner* — Nader Bolourchi
(74) *Attorney, Agent, or Firm* — Cozen O'Connor

(57) ABSTRACT

A method and a device (20) for decoding a frame capable of being split into p sub-frames each consisting of k information symbols, a first n–k redundant symbols and a last n–k redundant symbols. The decoding process uses two individual decoders (21, 23) which concurrently produce extrinsic data ($Extr_{1i}$, $Extr_{2i}$) respectively concerning information symbols and interleaved information symbols. The values of the extrinsic data ($Extr_{1i}$, $Extr_{2i}$) are refined by cross-feedback of said data to the input of the decoders (21, 23).

9 Claims, 3 Drawing Sheets

OTHER PUBLICATIONS

M. Azrel et al, "Analog slice turbo decoding", IEEE International Symposium on Circuits and Systems, http://ieeexplore.ieee.org/ie15/9898/31469/01464592.pdf, May 26, 2005.

D. Gnaedig et al., "Les Turbo-Codes a Roulettes", Internet Article, http://web.univ-ubs.fr/lester/{boutillon/articles/Gretsi_03_TCR.pdf, Feb. 3, 2004.

* cited by examiner

US 8,009,769 B2

METHOD AND A DEVICE FOR DECODING SLICE CODES

RELATED APPLICATION

This is a U.S. National Stage of International Application No. PCT/FR2006/050208 filed on Mar. 10, 2006.

FIELD OF THE INVENTION

The present invention relates to the field of telecommunications. Within that field, the invention relates more particularly to digital communications, which include both cable communications and wireless communications where the transmission channel may be a radio channel.

BACKGROUND OF THE INVENTION

Digital communications are making more and more use of channel coding varying from simple coding schemes to very complex ones. The principle of channel coding is to add controlled redundancy to information symbols to enable the receiver to detect the presence of transmission errors, and where applicable correct them. Existing codes include more particularly slice codes based on the principle illustrated by FIG. 1. A turbo encoder 1 uses p slices to effect coding with an efficiency of $R = K/N$. This turbo encoder includes an interleaver 3 and two identical encoders $2_1$ and $2_2$ typically effecting circular recursive systematic convolutional (CRSC) coding. The CRSC coder consists of p slices and, for each of them, encodes with an efficiency $r = k/n$ (k is the number of input symbols and n is the number of output symbols; n−k are the redundancies produced by the encoder). Turbo encoding therefore causes an input frame of $K = k \times p$ information symbols that can be split into sub-frames $Syst_i$, $Syst_2$, $Syst_p$ each of k symbols to correspond to a frame that may be considered as p concatenated sub-frames of identical size equal to k $+2 \times (n-k)$. Each sub-frame includes k information symbols and $2 \times (n-k)$ redundant symbols coming from the two encoders. The encoder $2_1$ successively codes by blocks of k symbols the k×p information symbols from the frame present at the input. The encoder $2_2$ successively codes by blocks of k symbols the k×p information symbols from the frame present at the input that has been entirely interleaved. For turbo coding with p slices, a turbo encoder effects 2×p successive coding operations, each taking into account k information symbols. The efficiency of the turbo encoder 1 is therefore given by the equation $R = k/(2 \times n - k)$ because $N = (k + 2 \times (n-k)) \times p$ and $K = k \times p$. For coding with $p = 2$ slices and where $Y_{11}$ and $Y_{12}$ denote the redundant symbols at the output of the first encoder $2_1$ and $Y_{21}$ and $Y_{22}$ denote the redundant symbols at the output of the second encoder $2_2$, the output frame consists of a first sub-frame comprising $Syst_i$, $Y_{11}$ and $Y_{21}$ and a second sub-frame comprising $Syst_2$, $Y_{12}$ and $Y_{22}$. In a first step the first encoder $2_1$ encodes the k information symbols $Syst_i$. In a second step it encodes the next k information symbols $Syst_2$. In parallel with this, the complete frame of size 2×k consisting of $Syst_i$ and $Syst_2$ is interleaved 3 and the result of this interleaving feeds the second encoder $2_2$. In a first step the second encoder encodes the first k information symbols. In a second step it encodes the next k information symbols resulting from the interleaving. Slice coding is described in the paper by D. Gnaedig, E. Boutillon, M. Jezequel, and V. Gaudet "On Multiple Slice Turbo Codes", $3^{rd}$ International Symposium On Turbo Codes & Related Topics, Brest, France, 1-5 September, 2003, p. 343-346.

The invention relates to decoding techniques. Decoding appropriate to slice coding uses a turbo decoder structure. This is known in the art. One such decoder is described in the paper by M. Arzel, C. Lahuec, M. Jezequel, and F. Seguin "Analog Decoding of Duo-Binary Codes", International Symposium on Information Theory and its Applications, ISITA2004, Parma, Italy, Oct. 10-13, 2004. The decoder 4 shown in FIG. 2 appropriate to coding with two slices includes four independent individual decoders $5_{11}$, $5_{12}$, $5_{21}$, $5_{22}$, two per slice. Each individual decoder operates on a portion of the received frame. The individual decoders $5_{11}$ and $5_{21}$ operate respectively on the first half of the received frame and on the first half of the received frame that has been fully interleaved, and the individual decoders $5_{12}$ and $5_{22}$ operate respectively on the second half of the received frame and on the second half of the received frame that has been fully interleaved. In the more general case of coding with p slices, the appropriate decoder requires the use of 2×p individual decoders. With an analog decoder, this has the drawback of requiring a large area of silicon proportional to the number of slices.

SUMMARY OF THE INVENTION

One object of the present invention is to provide a decoding method and device suitable for slice coding that do not have the drawbacks of the known methods and devices and consequently enable analog decoding at reduced cost by reducing the area of silicon occupied.

This and other objects are attained in accordance with one aspect of the present invention directed to a method for analog iterative decoding of a frame that can be split into p sub-frames each made up of k information symbols, a first n−k redundant symbols, and a last n−k redundant symbols, where n and k are two particular numbers. For one iteration, for a step i, for i varying from 1 to a maximum of p, the method includes first and second sequences of steps, wherein the first sequence comprises the steps of:

a first decoder decoding the k information symbols Syst; of the $i^{th}$ sub-frame and the first N−k redundant symbols $Y_{1i}$ of that same sub-frame to produce k extrinsic information symbols $Extr_{1i}$;

a first analog memory storing at a memory location depending on the step i the k preceding extrinsic information symbols $Extr_{1i}$;

interleaving all the data stored in the first memory; and injecting the interleaved data into the input of a second decoder to refine its decoding;

and wherein at least a portion of the second sequence is performed concurrently with at least a portion of the first sequence, and the second sequence comprises the steps of:

interleaving together the information symbols of all the sub-frames $Syst_1$, $Syst_2$, ..., $Syst_p$;

the second decoder decoding the k information symbols $\Pi(Syst)_i$ resulting from the interleaving and set from the $((i-1) \times k + 1)^{th}$ position and the last n−k redundant symbols $Y_{2i}$ of the $i^{th}$ sub-frame to produce k extrinsic information symbols $Extr_{2i}$;

a second memory storing at a memory location depending on the step 1 the k extrinsic information symbols $Extr_{2i}$ produced by the second decoder;

de-interleaving all the data stored in the second memory; and injecting the de-interleaved data into the input of the first decoder to refine its decoding.

Another aspect of the invention is directed to a device for analog decoding of a frame that can be split into n sub-frames each made up of k information symbols, a first n−k redundant symbols, and a last n−k redundant symbols, where n and k are two particular numbers. The device comprises:

a first decoder for decoding the k information symbols of the $i^{th}$ sub-frame and the first n−k redundant symbols of that same sub-frame, for i varying from 1 to a maximum of p, and for producing k extrinsic information symbols $Extr_{1i}$;

first means for interleaving all the information symbols of all the sub-frames;

a second decoder for decoding concurrently with the first decoder the k information symbols set from the $((i-1)\times k+1)^{th}$ position and coming from the first interleaver means and the last n−k redundant symbols of the $i^{th}$ sub-frame and for producing k extrinsic information symbols $Extr_{2i}$;

a first analog memory having a capacity at least equal to the overall size of the p×k extrinsic information symbols and second interleaver means for interleaving all the data stored by the first memory, at a break-in position between an output of the first decoder and an input of the second decoder;

a second analog memory having a capacity at least equal to the overall size of the p×k extrinsic information symbols and de-interleaver means for de-interleaving all the data stored by the second memory, at a break-in position between an output of the second decoder which produces k extrinsic information symbols and an input of the first decoder;

multiplexer means at the output of the first decoder for routing the k extrinsic information symbols $Extr_{1i}$ of an $i^{th}$ sub-frame coming from the first decoder at an input of the first memory to a memory location depending on each sub-frame;

multiplexer means at the output of the second decoder for routing the k extrinsic information symbols $Extr_{2i}$ of an $i^{th}$ sub-frame coming from the second decoder at an input of the second memory to a memory location depending on each sub-frame;

multiplexer means at the output of the second interleaver means for routing the k extrinsic information symbols coming from the second interleaver means and set from the $((i-1)\times k+1)^{th}$ position at the input of the second decoder; and multiplexer means at the output of the de-interleaver means for routing the k extrinsic information symbols coming from the de-interleaver means and set from the $((i-1)\times k+1)^{th}$ position at the input of the first decoder.

Thus a decoding method and a decoder device according to the invention perform analog decoding of frames that can be split into p sub-frames each consisting of k information symbols, a first n−k redundant symbols, and a last n−k redundant symbols.

The decoding method and device of the invention solve the stated problem. Decoding employs only two individual decoders whatever the number of slices used when coding the frames. This consequently limits the area of silicon occupied by the decoder.

Another aspect of the invention is directed to a data receiver including the above analog frame decoder device and a transmission system including at least one such receiver.

DETAILED DESCRIPTION OF THE DRAWINGS

Figure 1:
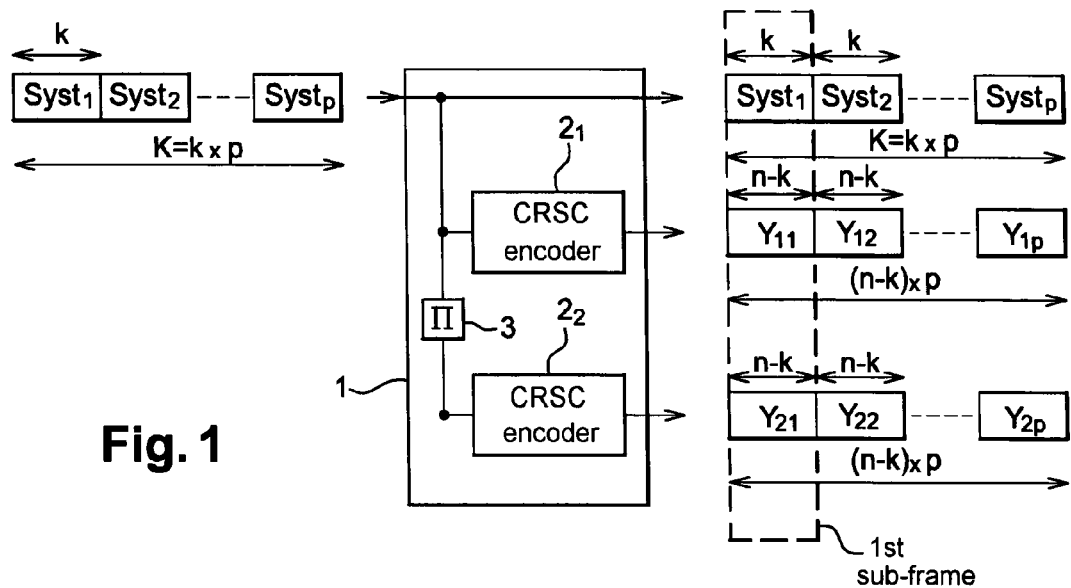
FIG. 1 is a theoretical diagram of s coding as described in the description of the field of the invention.
Figure 2:
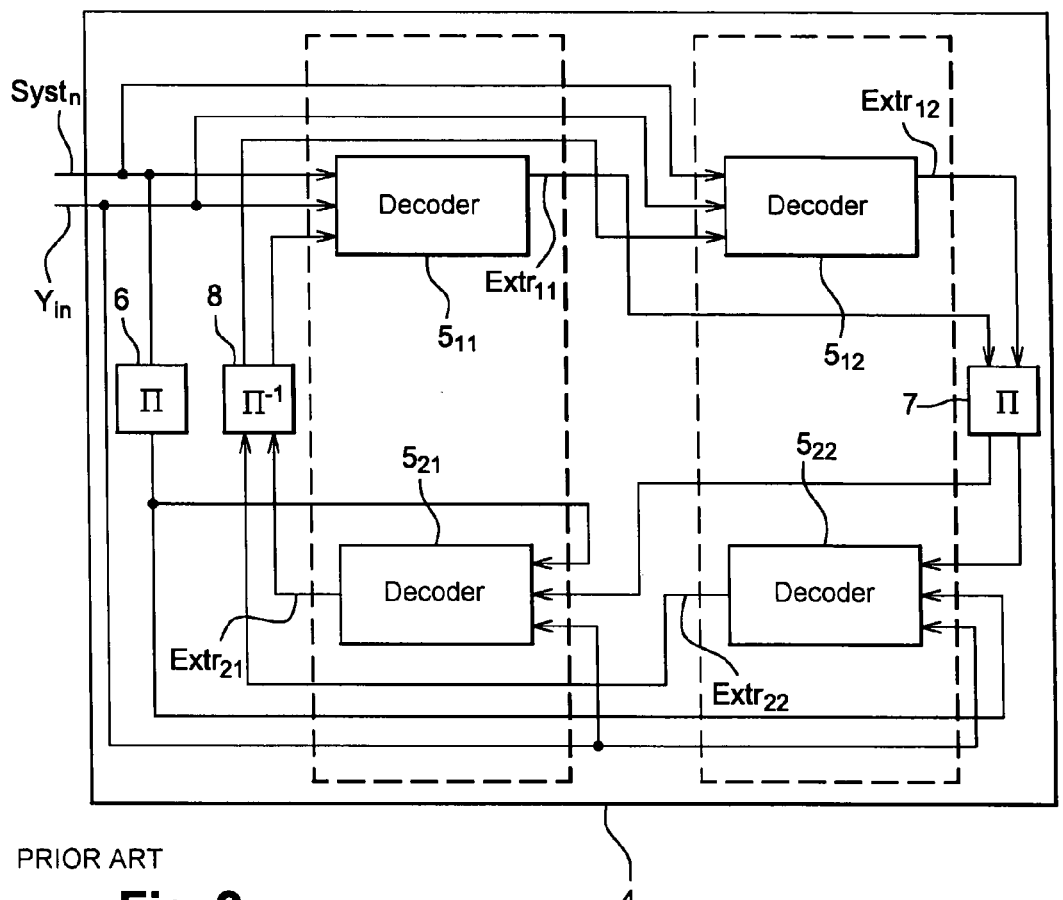
FIG. 2 is a theoretical diagram of a prior art decoder suitable for slice coding.
Figure 3:
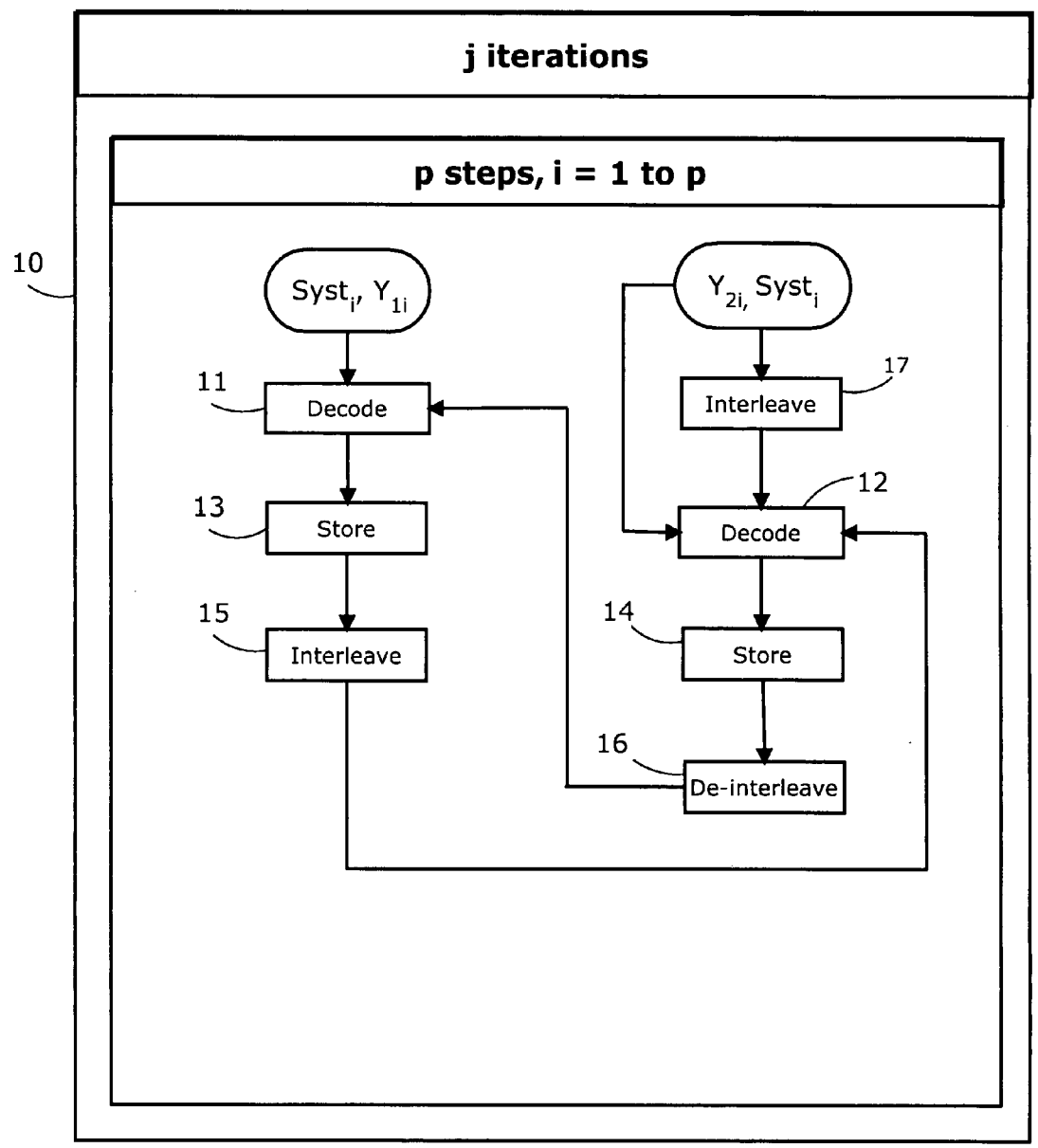
FIG. 3 is a theoretical diagram of decoding in accordance with the invention.

Decoding in accordance with the invention is described with reference to FIG. 3. Decoding in accordance with a method 10 of the invention is effected in a number j of iterations. The number j of iterations depends on the required decoding accuracy. Each iteration is divided into steps i.

The frame is split into p sub-frames each consisting of k information symbols and 2×(n−k) redundant symbols, where n and k are particular numbers. Assuming that the received frame results from slice coding, n is the frame size coded by one slice, i.e. the number of output symbols, and k is the number of input symbols of one slice. Each slice produces frames made up of k information symbols and (n−k) redundant symbols.

There are typically the same number of steps i as there are sub-frames in the received frame. The method can nevertheless be limited to a number of steps less than p, for example in a degraded version of the method.

For a step i the method includes first and second sequences of steps. The first sequence comprises the steps of:

a first decoder decoding 11 the k information symbols of the $i^{th}$ sub-frame and the first n−k redundant symbols of that same sub-frame; the decoding step 11 produces k extrinsic information symbols;

storing 13 in a first analog memory at a memory location depending on the step i the k extrinsic information symbols $Extr_{1i}$ produced by the first decoder;

interleaving 15 all the data stored in the first memory; and injecting the interleaved data into the input of a second decoder to refine its decoding 12.

The second sequence, at least a portion of which is performed concurrently with at least a portion of the first sequence, comprises the steps of:

interleaving 17 together the information symbols of all the sub-frames $Syst_1$, $Syst_2$, ..., $Syst_p$ to provide interleaved data $\Pi(Syst)_i$;

the second decoder decoding 12 the k information symbols $\Pi(Syst)_i$ resulting from the interleaving step 17 and set from the $((i-1)\times k+1)^{th}$ position and decoding the last n−k redundant symbols $Y_{2i}$ of the $i^{th}$ sub-frame; thus during the first step, the second decoder decodes the first k symbols resulting from the interleaving; the decoding step 12 produces k extrinsic information symbols $Extr_{2i}$;

a second analog memory storing 14 at a memory location depending on the step i the k extrinsic information symbols $Extr_{2i}$ produced by the second decoder;

de-interleaving 16 all the data stored in the second memory; and injecting the de-interleaved data into the input of the first decoder to refine its decoding 11.

Figure 4:
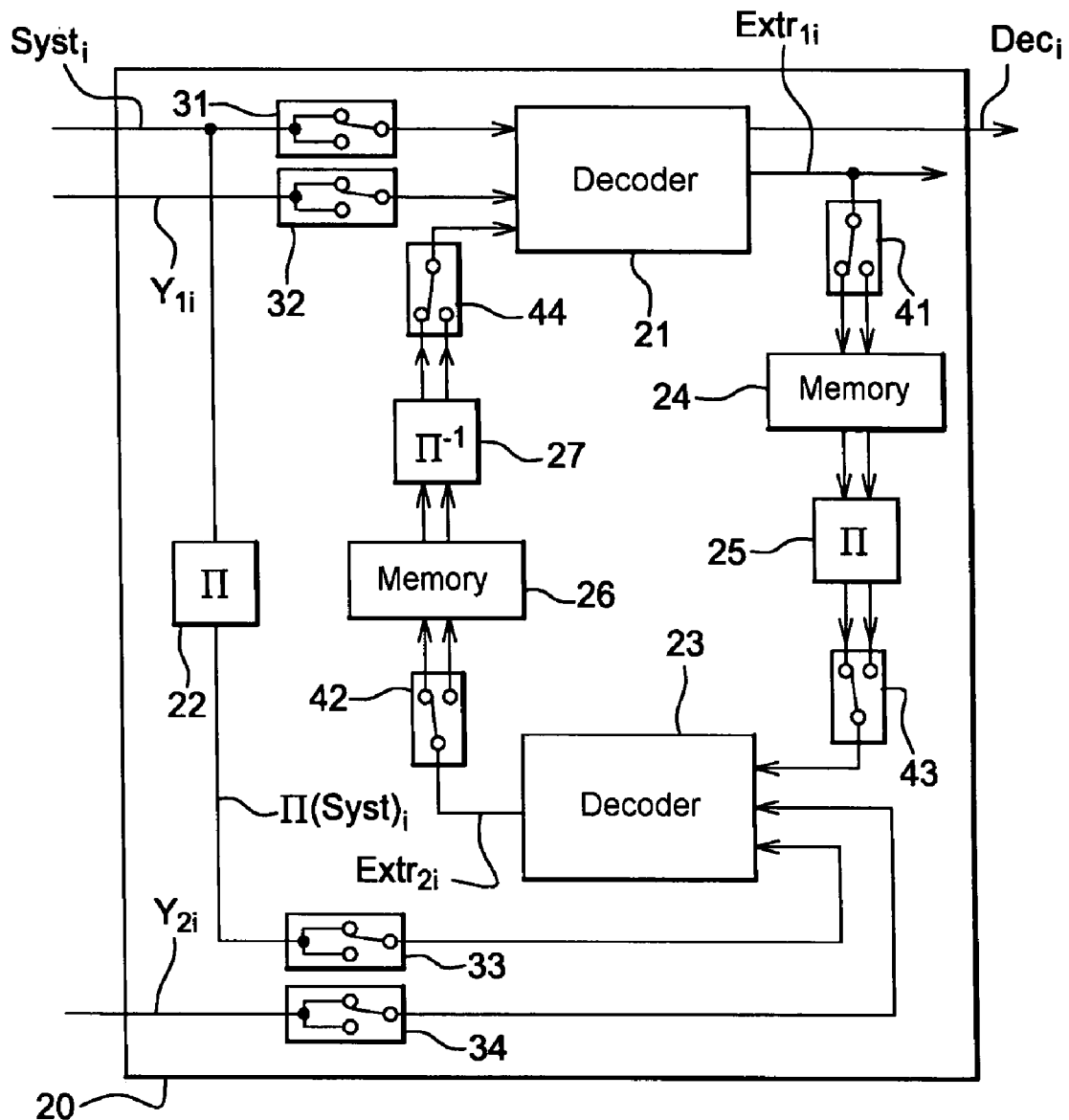
FIG. 4 is a theoretical diagram of a decoder according to the invention.

FIG. 4 is a theoretical diagram of a decoder 20 of the invention.

The decoder 20 includes a first individual decoder 21, first interleaver means 22, a second individual decoder 23 independent of the first individual decoder 21, a first analog memory 24, second interleaver means 25, a second analog memory 26, and de-interleaver means 27. It further includes first multiplexer means 31, 32 and second multiplexer means 33, 34. The first multiplexer means 31, 32 includes a first multiplexer 31 and a second multiplexer 32, for example, and the second multiplexer means 33, 34 includes a first multiplexer 33 and a second multiplexer 34, for example. The decoder 20 further includes multiplexer means 41 at the output of the first individual decoder 21, multiplexer means 42 at the output of the second individual decoder 23, multiplexer means 43 at the output of the second interleaver means 25, and multiplexer means 44 at the output of the de-interleaver means 27.

The first multiplexer 31 routes the information symbols $(Syst_i)_{i=1...p}$ at the input of the first decoder 21 sub-frame by sub-frame. The second multiplexer 32 routes the first n−k redundant symbols $(Y_{1i})_{i=1...p}$ at the input of the first decoder 21 sub-frame by sub-frame and in relation with the first multiplexer 31: for a given sub-frame i, the redundant symbols $Y_{1i}$ and the corresponding information symbols $Syst_i$ are present simultaneously at the input of the first decoder 21.

The first individual decoder 21 decodes simultaneously k information symbols $Syst_i$ of a sub-frame i and the n−k redundant symbols $Y_{1i}$ of that same sub-frame i. The first individual decoder 21 produces k extrinsic information symbols $Extr_{1i}$.

The multiplexer means 41 at the output of the first decoder 20 route the k extrinsic information symbols $Extr_{1i}$ of an $i^{th}$ sub-frame coming from the first individual decoder 21 at the input of the first memory 21 to a memory location depending on each sub-frame i.

The first memory 24 stores the k extrinsic information symbols $Extr_{1i}$ produced by the first individual decoder 21.

The second interleaver means 25 interleave the stored data present at the output of the first analog memory 24. The result of this interleaving is injected via the multiplexer means 43 into the input of the second individual decoder 23 to refine its decoding.

The multiplexer means 43 at the output of the second interleaver means 25 route the k extrinsic information symbols coming from the second interleaver means 25 and set from the $((i-1) \times k+1)^{th}$ position at the input of the second decoder 23.

The first interleaver means 22 interleave together the information symbols of all the sub-frames $(Syst_i)_{i=1...p}$.

The first multiplexer 33 routes the k information symbols $\Pi(Syst)_i$ coming from the first interleaver means 22 at the input of the second decoder 23.

The second multiplexer 34 routes the last n−k redundant symbols $Y_{2i}$ sub-frame by sub-frame in relation with the first multiplexer 33 and the first multiplexer means 31, 32 at the input of the second decoder 23: for a given sub-frame i, the information symbols $Syst_i$ and the corresponding redundant symbols $Y_{1i}$ are present simultaneously at the input of the first decoder 21 and the information symbols $\Pi(Syst)_i$ and the corresponding redundant symbols $Y_{2i}$ are present simultaneously at the input of the second decoder 23.

The second individual decoder 23 simultaneously decodes k information symbols $\Pi(Syst)_i$ coming from the first interleaver means 22 and the last n−k redundant symbols $Y_{2i}$ of a sub-frame i. The second individual decoder 23 produces k extrinsic information symbols $Extr_{2i}$.

The multiplexer means 42 at the output of the second decoder 23 route the k extrinsic information symbols of an $i^{th}$ sub-frame coming from the second decoder 23 at the input of the second memory 26 to a memory location depending on each sub-frame i.

The second memory 26 stores the k extrinsic information symbols $Extr_{2i}$ produced by the second individual decoder 23.

The de-interleaver means 27 de-interleave the stored data present at the output of the second analog memory 26. The result of this de-interleaving is injected via the multiplexer means 44 into the input of the first individual decoder 21 to refine its decoding.

The multiplexer means 44 at the output of the de-interleaver means route the k extrinsic information symbols coming from the de-interleaver means and set from the $((i-1) \times k+)^{th}$ position at the input of the first decoder.

The use of a decoder of the invention, illustrated with reference to FIG. 4, is as follows.

The example adopted to illustrate the decoding effected by the decoder 20 assumes that the received frame has a structure identical to that of a frame produced by channel coding using CRSC coding with two slices. That coding generates two sub-frames:

$Syst_1 \, Y_{11} \, Y_{21}$ and $Syst_2 \, Y_{12} \, Y_{22}$.

To each of those sub-frames there corresponds a step of a decoding method of the invention.

The following description is valid for one iteration and must be repeated for the subsequent iterations.

Decoding can begin only if the complete frame has been received. The systematic portion denoted $(Syst_i)_{i=1...p}$, the interleaved systematic portion denoted $(\Pi(Syst)_i)_{i=1...p}$, and the redundant portions denoted $(Y_{1i})_{i=1...p}$ and $(Y_{2i})_{i=1...p}$ are then presented to the input of the decoding structure.

Before beginning the first iteration, in a typical initialization phase, the first and second memories 24, 26 are filled beforehand with equally probable values.

Step 1.

In a first sequence, the first multiplexer 31 and the second multiplexer 32 of the first multiplexer means select $Syst_1$ and $Y_{11}$ and present them to the input of the first decoder 21. This first decoder 21 produces at its output the extrinsic information $Extr_{11}$ (indicating the reliability of the received data $Syst_1$). This extrinsic information $Extr_{11}$ is loaded into a first portion of the first memory 24. The size of this first memory 24 is proportional to the total size of the systematic data $Syst_1$ plus $Syst_2$. The first portion of the memory is typically its first half. Consequently, a portion of the first memory 24 continues to be filled with the equally probable values previously entered. In this example, that portion corresponds to the second half of the memory. The combination of the stored data $Extr_{11}$ and the remaining equally probable values is present at the output of the first memory 24 and is interleaved by the second interleaver means 25. The multiplexer means 43 select the first half of the interleaved extrinsic information (some of which is information being calculated and more of which still consists of the equally probable values) and presents it to the input of the second decoder 23.

In a second sequence, the first interleaver means 22 interleave together the information symbols of all the subframes $(Syst_i)_{i=1...p}$. The first multiplexer 33 and the second multiplexer 34 of the second multiplexer means select $\Pi(Syst)_i$ coming from the first interleaver means 22 and $Y_{21}$ and present them to the input of the second decoder 23. The second decoder produces extrinsic information $Extr_{21}$ (indicating the reliability of the data $\Pi(Syst)_1$) which is loaded into the first half of the second memory 26. The size of this second memory 26 is proportional to the total size of the systematic data $Syst_1$ plus $Syst_2$. A portion of the second memory 26 is therefore still filled with the equally probable values previously entered. The combination of the stored data $Extr_{21}$ and the remaining equally probable values is present at the output of the second memory 26 and is de-interleaved by the de-interleaver means 27. The multiplexer means 44 select the first half of the de-interleaved extrinsic information (some of which is information being calculated and more of which still consists of the equally probable values) and presents them to the input of the first decoder 21.

Continuous exchanges are effected between the first and second decoders 21, 23. Convergence and stabilization of the extrinsic information are observed. This phenomenon is specific to an analog turbo decoder structure. Once convergence has been established, the extrinsic information $Extr_{11}$ and $Extr_{21}$ continue to be stored in a portion of the first and second memories 24, 26, respectively. Step 2 can then begin.

Step 2.

In a first sequence, the first multiplexer 31 and the second multiplexer 32 of the first multiplexer means switch to select $Syst_2$ and $Y_{12}$ and present them to the input of the first decoder 21. This first decoder 21 produces at its output the extrinsic information $Extr_{12}$ (indicating the reliability of the received data $Syst_2$), which is loaded into a second portion of the first memory 24 because the multiplexer means 41 have switched in cooperation with the first multiplexer means 31, 32. According to this example, this second portion corresponds to the second half of the first memory 24. The stabilized extrinsic information $Extr_{11}$ resulting from the preceding step continues to be stored in the other half of the first memory 24. All the data is interleaved by the second interleaver means 25. The multiplexer means 43 select the second half of the interleaved data (some of which is information being calculated and more of which is the result of the continuous calculation of the step 1) and presents it to the input of the second decoder 23.

In a second sequence, the first multiplexer 33 and the second multiplexer 34 of the second multiplexer means select $\Pi(Syst)_2$ and $Y_{22}$ and present them to the input of the second decoder 23. The second decoder 23 produces the extrinsic information $Extr_{22}$ that is loaded into the second half of the second memory 26. All of the stored data $Extr_{22}$ and $Extr_{21}$ ($Extr_{21}$ is the result of the preceding step and is stored in a portion of the memory) is present at the output of the second memory 26 and is de-interleaved by the de-interleaver means 27. The multiplexer means 44 select the second half of the de-interleaved extrinsic information and presents it to the input of the first decoder 21.

Thus the two decoders communicate directly and can again and continuously exchange their extrinsic information to improve their accuracy and consequently enhance the quality of decoding. The continuity in time of the exchange of this analog data is a fundamental property of an analog turbo decoder; this property is absent from a digital turbo decoder.

During this first iteration, the complete frame is decoded in two stages by an analog turbo decoder device. The operations effected during the second step exploit the results of the first step (using the extrinsic information stored in the memories). In contrast, the operations effected during the first step do not derive much if any benefit from the results of the second step, since the content of the memories is initialized to equally probable values. It is generally necessary to launch a second iteration so that, in particular, during the step 1, the second decoder 23 can benefit from the presence at its input of the extrinsic information $Extr_{11}$ of the second iteration and the extrinsic information $Extr_{12}$ of the step 2 of the first iteration via the second interleaver means 25. This can cause the extrinsic information $Extr_{11}$ and $Extr_{12}$ to converge toward other values that reflect better the reliability of the received data $Syst_1$ and $Syst_2$. To improve accuracy further, the iterative process can repeat as many times as necessary. However, beyond a limit number of iterations (generally equal to 15) the values of the extrinsic information remain virtually identical from one iteration to another.

On the last iteration, the decoder 21 supplies the same number of binary decisions as the number of systematic symbols received. In each step i of this final iteration, k binary decisions are produced and constitute the block $Dec_i$ that is supplied to the next stage of a receiver, for example a digital memory that stores the frame $(Dec_i)_{i=1 \ldots p}$.

A decoder according to the invention can easily be adapted to decode frames obtained by coding with p slices of different sizes. The size of the multiplexers 31, 32, 33, 34, 41, 42, 43, 44, the size of the memories 24, 26, and the size of the decoders 21, 23 must then be adapted to the largest slice. The size of the analog memories must be proportional to the number of items of extrinsic information and therefore to the number of systematic symbols in the complete frame. An iteration is then divided into p steps. During each step, a portion of the data associated with a slice is processed by the analog turbo architecture. The sizes of the decoders 21, 23, the interleaver 25, and the de-interleaver 27 are then adapted to the size of the slice being processed. This method is therefore of real benefit because it dispenses with the multiplicity of decoders that causes relatively high congestion on the silicon. The structure of a decoder of the invention, which comprises only two individual decoders, preserves partial analog processing despite the presence of the multiplexers. The analog memories allow continuous exchange and simultaneous saving of the extrinsic information.

The invention claimed is:

1. A method for iterative analog decoding of a frame that can be split into p sub-frames each made up of k information symbols, a first n–k redundant symbols, and a last n–k redundant symbols, where n and k are two particular numbers, wherein for one iteration in effecting a succession of steps such that for a step i, i varying from 1 to a maximum of p, the method includes first and second sequences of steps,
   A. wherein the first sequence comprises the steps of:
      (i) decoding by a first decoder the k information symbols $(Syst_i)$ of the $i^{th}$ sub-frame and the first n–k redundant symbols $(Y_{1i})$ of that same sub-frame to produce k extrinsic information symbols $(Extr_{1i})$;
      (ii) storing in a first analog memory at a memory location depending on the step i the k preceding extrinsic information symbols $(Extr_{1i})$;
      (iii) interleaving all data stored in the first analog memory; and
      (iv) injecting the interleaved data into the input of a second decoder to refine its decoding; and
   B. wherein at least a portion of the second sequence is performed concurrently with at least a portion of the first sequence, and the second sequence comprises the steps of:
      (i) interleaving the information symbols of all the sub-frames $(Syst_1, Syst_2, \ldots, Syst_p)$;
      (ii) decoding by the second decoder the k information symbols $(\Pi(Syst)_i)$ resulting from the interleaving and set from the $((i-1) \times k+1)^{th}$ position and the last n–k redundant symbols $(Y_{2i})$ of the $i^{th}$ sub-frame to produce k extrinsic information symbols $(Extr_{2i})$;
      (iii) storing in a second memory at a memory location depending on the step i the k extrinsic information symbols $(Extr_{2i})$ produced by the second decoder;
      (iv) de-interleaving all data stored in the second memory; and
      (v) injecting the de-interleaved data into the input of the first decoder to refine its decoding.

2. The method according to claim 1, wherein i varies from 1 to p.

3. The method according to claim 1, wherein the received frame is formatted in accordance with a format obtained after channel coding with p slices.

4. The method according to claim 1, wherein the number of iterations is determined as a function of a given decoding accuracy.

5. The method according to claim 1, wherein the method initializes the content of the memories to equally probable values.

6. A device for analog decoding of a frame that can be split into p sub-frames each made up of k information symbols, a first n−k redundant symbols, and a last n−k redundant symbols, where n and k are two particular numbers, comprising:
- a first decoder for decoding the k information symbols of the $i^{th}$ sub-frame and the first n−k redundant symbols of that same sub-frame, i varying from 1 to a maximum of p, and for producing k extrinsic information symbols ($Extr_{1,i}$);
- first means for interleaving all the information symbols of all the sub-frames;
- a second decoder for decoding concurrently with the first decoder the k information symbols set from the $((i-1) \times k+1)^{th}$ position and coming from the first interleaver means and the last n−k redundant symbols of the $i^{th}$ sub-frame and for producing k extrinsic information symbols ($Extr_{2,i}$);
- a first analog memory having a capacity at least equal to the overall size of the p×k extrinsic information symbols and second interleaver means for interleaving all data stored in the first memory, at a break-in position between an output of the first decoder and an input of the second decoder;
- a second analog memory having a capacity at least equal to the overall size of the p×k extrinsic information symbols and de-interleaver means for de-interleaving all data stored in the second memory, at a break-in position between an output of the second decoder which produces k extrinsic information symbols and an input of the first decoder;
- multiplexer means at the output of the first decoder for routing the k extrinsic information symbols ($Extr_{1,i}$) of an $i^{th}$ sub-frame coming from the first decoder at an input of the first memory to a memory location depending on each sub-frame;
- multiplexer means at the output of the second decoder for routing the k extrinsic information symbols ($Extr_{2,i}$) of an $i^{th}$ sub-frame coming from the second decoder at an input of the second memory to a memory location depending on each sub-frame;
- multiplexer means at the output of the second interleaver means for routing the k extrinsic information symbols coming from the second interleaver means and set from the $((i-1) \times k+1)^{th}$ position at the input of the second decoder; and
- multiplexer means at the output of the de-interleaver means for routing the k extrinsic information symbols coming from the de-interleaver means and set from the $((i-1) \times k+1)^{th}$ position at the input of the first decoder.

7. The device according to claim 6 further including:
- multiplexer means at the input of the first decoder for routing the k information symbols of the $i^{th}$ sub-frame and the first n−k redundant symbols of that same sub-frame at the input of the first decoder; and
- multiplexer means at the input of the second decoder for routing the last n−k redundant symbols of the $i^{th}$ sub-frame and the k information symbols coming from the first interleaver means and set from the $((i-1) \times k+1)^{th}$ position at the input of the second decoder.

8. A data receiver including at least one analog frame decoder device according to claim 6.

9. A transmission system including at least one receiver according to claim 8.

* * * * *